(12) United States Patent
Zhu et al.

(10) Patent No.: US 8,598,595 B2
(45) Date of Patent: Dec. 3, 2013

(54) SEMICONDUCTOR DEVICE AND METHOD FOR MANUFACTURING THE SAME

(75) Inventors: Huilong Zhu, Poughkeepsie, NY (US); Zhijiong Luo, Poughkepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/003,873

(22) PCT Filed: Sep. 26, 2010

(86) PCT No.: PCT/CN2010/001486
§ 371 (c)(1),
(2), (4) Date: Jan. 12, 2011

(87) PCT Pub. No.: WO2012/000146
PCT Pub. Date: Jan. 5, 2012

(65) Prior Publication Data
US 2013/0161642 A1 Jun. 27, 2013

(30) Foreign Application Priority Data
Jun. 30, 2010 (CN) .......................... 2010 1 0223470

(51) Int. Cl.
*H01L 21/00* (2006.01)
(52) U.S. Cl.
USPC ............................. 257/77; 257/316; 257/402
(58) Field of Classification Search
USPC ........................................... 257/77, 316, 402
See application file for complete search history.

(56) References Cited

U.S. PATENT DOCUMENTS 6,413,802 B1 * 7/2002 Hu et al. ....................... 438/151
6,458,662 B1 * 10/2002 Yu ................................. 438/286
(Continued)

FOREIGN PATENT DOCUMENTS

CN 1695227 A 11/2005
CN 1728402 A 2/2006
(Continued)

OTHER PUBLICATIONS

International Search Report, dated Mar. 20, 2011 in International Application No. PCT/CN2010/001486.
(Continued)

*Primary Examiner* — Laura Menz
(74) *Attorney, Agent, or Firm* — Knobbe Martens Olson & Bear LLP

(57) ABSTRACT

The present application discloses a semiconductor device and a method for manufacturing the same. The semiconductor device comprises an SOI substrate; a semiconductor fin formed on the SOI substrate, the semiconductor fin having a first side and a second side which are opposite to each other and stand upward on a surface of the SOI substrate, and a trench which is opened at a central portion of the second side and opposite to the first side; a channel region formed in the fin and being between the first side and the trench at the second side; source and drain regions formed in the fin and sandwiching the channel region; and a gate stack formed on the SOI substrate and being adjacent to the first side of the fin, wherein the gate stack comprises a first gate dielectric extending away from the first side and being adjacent to the channel region, a first conductor layer extending away from the first side and being adjacent to the first gate dielectric, a second gate dielectric extending away from the first side and being adjacent laterally to one side of the first conductor layer, and a second conductor layer extending away from the first side and being adjacent laterally to one side of the second gate dielectric. The embodiments of the invention can be applied in manufacturing an FinFET.

12 Claims, 12 Drawing Sheets

(56) References Cited

U.S. PATENT DOCUMENTS

| | | | |
|---|---|---|---|
| 7,087,952 B2 * | 8/2006 | Zhu et al. | 257/315 |
| 7,217,623 B2 * | 5/2007 | Kim et al. | 438/283 |
| 7,589,387 B2 * | 9/2009 | Hwang et al. | 257/401 |
| 7,619,276 B2 * | 11/2009 | Zhu | 257/316 |
| 7,691,690 B2 * | 4/2010 | Zhu et al. | 438/157 |
| 7,898,021 B2 * | 3/2011 | Zhu et al. | 257/324 |
| 8,149,619 B2 * | 4/2012 | Kirsch et al. | 365/185.08 |
| 8,247,278 B2 * | 8/2012 | Zhu et al. | 438/197 |
| 8,391,059 B2 * | 3/2013 | Lu et al. | 365/182 |
| 8,486,770 B1 * | 7/2013 | Wu et al. | 438/142 |
| 2006/0022270 A1 | 2/2006 | Boyd et al. | |
| 2007/0190720 A1 | 8/2007 | Li et al. | |
| 2007/0252211 A1 * | 11/2007 | Yagishita | 257/351 |
| 2008/0171408 A1 * | 7/2008 | Zhu et al. | 438/157 |
| 2009/0032859 A1 * | 2/2009 | Zhu | 257/316 |
| 2009/0108324 A1 * | 4/2009 | Zhu et al. | 257/316 |
| 2011/0193164 A1 * | 8/2011 | Zhu | 257/347 |
| 2012/0007166 A1 * | 1/2012 | Zhu et al. | 257/319 |
| 2012/0038006 A1 * | 2/2012 | Zhu et al. | 257/402 |
| 2012/0171833 A1 * | 7/2012 | Zhu et al. | 438/303 |
| 2013/0011983 A1 * | 1/2013 | Tsai et al. | 438/285 |
| 2013/0161642 A1 * | 6/2013 | Zhu et al. | 257/77 |
| 2013/0168771 A1 * | 7/2013 | Wu et al. | 257/351 |

FOREIGN PATENT DOCUMENTS

| | | |
|---|---|---|
| CN | 1731589 A | 2/2006 |
| CN | 101438393 A | 5/2009 |
| WO | WO 2004/049406 A1 | 6/2004 |

OTHER PUBLICATIONS

Fiegna et al., "Scaling the MOS Transistor Below 0.1 $\mu$m: Methodology, Device Structure, and Technology Requirements", IEEE Transaction on Electron Devices, vol. 41, No. 6, Jun. 1994.

Jacobs et al., "Channel Profile Engineering for MOSFET's with 100 nm Channel Lengths", IEEE Transaction on Electron Devices, vol. 42, No. 5, May 1995.

Shahidi et al., "Indium Channel Implants for Improved MOSFET Behavior at the 100-nm Channel Length Regime", IEEE Transaction on Electron Devices, vol. 36, No. 11, Nov. 1989.

Thompson et al., "Linear versus Saturated Drive Current: Tradeoffs in Super Steep Retrograde Well Engineering", IEEE, 1996 Symposium on VSLI Technology Digest of Tecnical Papers, 1996.

* cited by examiner

SEMICONDUCTOR DEVICE AND METHOD FOR MANUFACTURING THE SAME

RELATED APPLICATIONS

This application is a national phase under 35 U.S.C. §371 of International Application No. PCT/CN2010/001486, filed Sep. 26, 2010, which claims priority to Chinese Patent Application No. 201010223470.6, filed Jun. 30, 2010, each of which is hereby incorporated by reference in its entirety.

BACKGROUND OF THE INVENTION

1. Field of Invention

The present invention relates to a semiconductor device and a method for manufacturing the same, in particular, to an FinFET formed on a semiconductor-on-insulator (SOI) substrate and used as a non-volatile memory cell (NVM).

2. Description of Prior Art

One important trend in the integrated circuits is scaling down of metal-oxide-semiconductor field effect transistors (MOSFETs) so as to achieve a high integration degree of devices and reduce a cost of manufacture. However, it is well known that a short channel effect occurs with a reduced size of the MOSFET. When the size of the MOSFET is scaled down, a gate of the MOSFET has a smaller effective length and actually controls fewer charges in a depletion region when a gate voltage is applied. Consequently, the MOSFET has a reduced threshold voltage with a reduced channel length.

A conventional planar MOSFET has a tri-layer structure including a gate electrode, a semiconductor layer, and a gate dielectric sandwiched therebetween. A channel region is provided in the semiconductor layer below the gate electrode, and source/drain regions are provided in the semiconductor layer adjacent to and at two opposing sides of the channel region. A silicide layer may be provided on the source/drain regions and then coupled with source/drain electrodes through vias so as to reduce a parasitic resistance or a parasitic capacitance of the device. The planar MOSFET suffers from the short channel effect and has a threshold voltage fluctuating with variation of the channel length.

To suppress the short channel effect, in U.S. Pat. No. 6,413,802 Chenming Hu et al. disclose an FinFET formed on an SOI substrate, comprising a channel region provided in a central portion of a semiconductor fin, and source/drain regions provided at two ends of the semiconductor fin. A gate electrode is provided at both sides of the channel region and surrounds the latter to provide for example a double gate FinFET. Inversion channels are induced at both sides of the fin. The channel region in the fin has a small thickness so that the whole channel region is controlled by the gate, as a result of which, the short channel effect is suppressed.

However, in a conventional FinFET, a gate is provided between and extends parallel to source/drain regions. Since the distance between the source/drain region and the gate is typically so small that capacitive coupling is introduced therebetween, the resultant device has a large parasitic capacitance.

Moreover, the capacitive coupling between the source/drain region and the gate limits the freedom of device design. For example, if one attempts to reduce a parasitic resistance, a thickness of the source/drain region may have to be increased. However, the source/drain region having a larger thickness also means an increased coupling area between the source/drain region and the gate, which in turn causes an increased parasitic capacitance, or vice versa. Thus, one skilled person in the art can not reduce both of the parasitic resistance and the parasitic capacitance in a conventional FinFET.

Consequently, the conventional FinFET has a delay due to a large value of the time constant RC and thus has a low switching speed.

The inventor proposed an NVM using an FinFET in U.S. Pat. No. 7,087,952, in which each FinFET has a control gate at one side of a semiconductor fin and a floating gate at the other side of the semiconductor fin. In such a floating-gate type memory device, charges tunnel from a substrate through a first gate dielectric layer to a floating gate, and are stored in the floating gate. The charges remain even in a case that the memory device is not powered. The amount of charges determines a threshold voltage (Vth) of the FinFET, due to which, a logic 1 and a logic 0 can be distinguished from each other.

The inventor proposed another NVM using an FinFET in U.S. Pat. No. 7,619,276, in which each FinFET has a floating gate at one side of a semiconductor fin, and two control gates at both sides of the semiconductor fin. The control gates have lengths larger than that of the floating gate in a direction along which the fin extends.

However, those problems in the conventional FinFET can still be found in the NVM using an FinFET. Due to the capacitive coupling between the source/drain region and the gate, NVM has a low access speed.

SUMMARY OF THE INVENTION

An object of the present invention is to provide an NVM suppressing the short channel effect and having an increased access speed.

Another object of the present invention is to provide an NVM which has improved electrical properties due to the induced stress.

According to one aspect of the invention, there provides a semiconductor device, comprising an SOI substrate; a semiconductor fin formed on the SOI substrate, the semiconductor fin having a first side and a second side which are opposite to each other and stand upward on a surface of the SOI substrate, and a trench which is opened at a central portion of the second side and opposite to the first side; a channel region formed in the fin and being between the first side and the trench at the second side; source and drain regions formed in the fin and sandwiching the channel region; and a gate stack formed on the SOI substrate and being adjacent to the first side of the fin, wherein the gate stack comprises a first gate dielectric extending away from the first side and being adjacent to the channel region, a first conductor layer extending away from the first side and being adjacent to the first gate dielectric, a second gate dielectric extending away from the first side and being adjacent laterally to one side of the first conductor layer, and a second conductor layer extending away from the first side and being adjacent laterally to one side of the second gate dielectric.

According to another aspect of the invention, there provides a method for manufacturing a semiconductor device, comprising steps of: providing an SOI substrate; forming a semiconductor fin formed on the SOI substrate, the semiconductor fin having a first side and a second side which are opposite to each other and stand upward on a surface of the SOI substrate; forming a gate stack on the SOI substrate, the gate stack comprising a first gate dielectric extending away from the first side and being adjacent to the channel region, a first conductor layer extending away from the first side and being adjacent to the first gate dielectric, a second gate dielectric extending away from the first side and being adjacent laterally to one side of the first conductor layer, and a second conductor layer extending away from the first side and being adjacent laterally to one side of the second gate dielectric; forming source and drain regions at two ends of the semiconductor fin; and etching the second side of the semiconductor fin to provide a trench which is opened at a central portion of the second side and opposite to the first side, so as to provide a channel region between the first side of the trench at the second side.

The above semiconductor device is used as an NVM, where the first conductor layer serves as a floating gate for storing charges, and the second conductor layer serves as a control gate.

It should be noted that the inventive semiconductor device includes a semiconductor fin but has a structure different from a conventional FinFET, because its gate is provided only at one side of the fin and extends away from the one side of the fin. As a comparison, the conventional FinFET typically has a double gate structure which surrounds a channel region at the central portion of fin. Moreover, in the present invention, the source/drain regions are provided at two ends of the fin and extend in a direction opposite to the direction in which the gate extends.

Since the gate does not extend between the source/drain regions and is not parallel to the source/drain regions in the inventive semiconductor device, there is no capacitive coupling between the source/drain region and the gate. Thus, the inventive semiconductor device has a reduced parasitic capacitance. Furthermore, the inventive semiconductor device allows a reduced parasitic resistance by providing source/drain regions having a relatively larger thickness.

Charge carriers have a reduced length of electrical conduction path because the source and drain regions have thicknesses larger then that the channel region, which allows further suppression of the parasitic effect relevant with the parasitic capacitance and the parasitic resistance.

Moreover, the inventive semiconductive device can have an increased switching speed by providing stressors for the source/drain region which induce stress in the channel region and increase a mobility of charge carriers.

For the purpose of effectively controlling the short channel effect, the channel region is formed by a self-alignment process and has a very small thickness, for example in the range of 5-40 nm. Preferably, a super steep retrograde well (SSRW) is used so as to decrease the thickness of the channel region. Even in a case that the gate is provide only at one side of the fin, the gate can completely control the channel region, which suppress the short channel effect.

In a preferred embodiment, the short channel effect is suppressed by incorporation of the fin structure, the parasitic capacitance and resistance are reduced by incorporation of the gate conductor which extends away from the fin but in a direction opposite to the source/drain region, and the mobility of the charge carriers in the channel is increased by incorporation of the stressor.

Thus, the inventive semiconductor device has an increased access speed, a larger threshold and reduced power consumption when used as the NVM.

DETAILED DESCRIPTION OF PREFERRED EMBODIMENTS

Figure 1A:
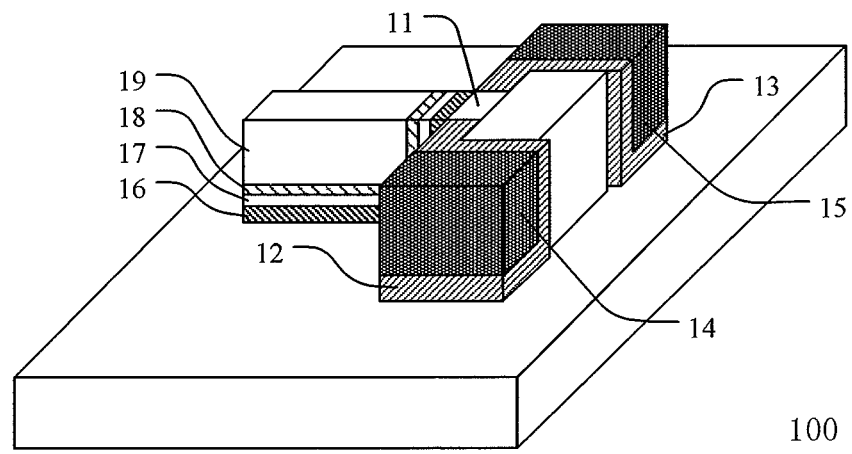
FIGS. 1A and 1B are a perspective view and a top view respectively of a structure of a semiconductor device according to an embodiment of the present invention, wherein the top view shows lines A-A', 1-1' and 2-2' for taking cross sections of the following figures.

Exemplary embodiments of the present invention are described in more details below with reference to the accompanying drawings. In the drawings, like reference numerals denote like members. The figures are not drawn to scale, for the sake of clarity.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step and fabricating method of the device, for a better understanding of the present invention. Nevertheless, it is understood by one skilled person in the art that these details are not always essential for but can be varied in a specific implementation of the invention Unless the context clearly indicates otherwise, each part of the semiconductor device can be made of material(s) well-known to one skilled person in the art. As an initial structure, an SOI substrate can be for example silicon-on-insulator substrate, silicon germanium-on-insulator substrate, or multilayer semiconductor-on-insulator substrate. The multilayer semiconductor includes for example group-III-V semiconductor, such as GaAs, InP, GaN, and SiC. A gate conductor can be for example a metal layer, a doped polysilicon layer, or a multilayer gate conductor including a metal layer and a doped polysilicon layer. The conductor layer is made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni3Si, Pt, Ru, Ir, Mo, HfRu, RuOx, and their combinations. A gate dielectric is made of SiO2, a high-k material which has a dielectric constant larger than that of SiO2, or the like, such as an oxide, a nitride, an oxynitride, a silicate, an aluminate, and a titanate.

The oxide includes for example SiO2, HfO2, ZrO2, Al2O3, TiO2, and La2O3. The nitride includes for example Si3N4. The silicate includes for example HfSiOx. The aluminate includes for example LaAlO3. The titanate includes for example SrTiO3. The oxynitride includes for example SiON. Moreover, the gate dielectric can be made of those developed in the future, besides the above known materials.

Figure 1B:
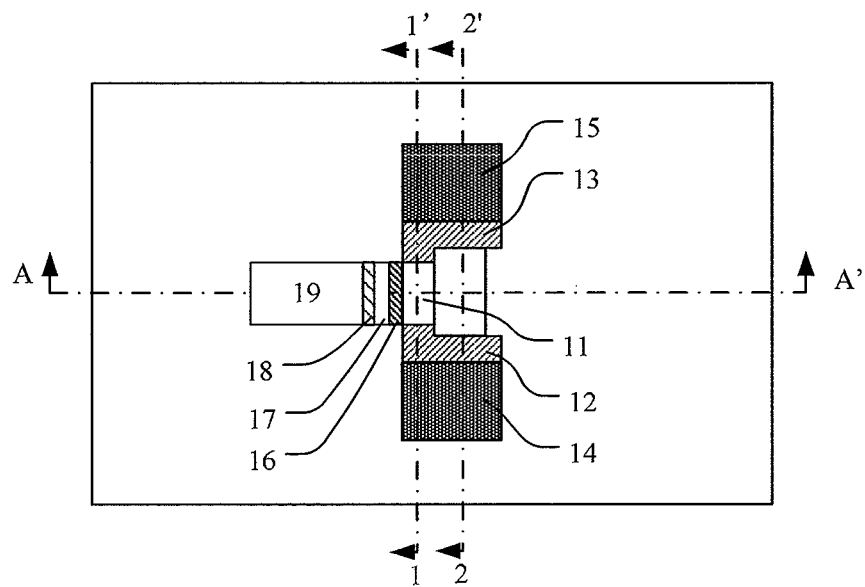

FIGS. 1A and 1B are perspective and top views respectively of a structure of a semiconductor device according to an embodiment of the present invention. Lines A-A', 1-1' and 2-2' in FIG. 1B indicate where the following cross-sectional views are taken. Specifically, line A-A' is perpendicular to a length direction of a channel region and through a gate, line 1-1' is parallel to the length direction of the channel region and through the channel region, and line 2-2' is also parallel to the length direction of the channel region but through an insulating filler between source/drain regions.

For simplicity, a left side of the fin is referred as a first side, and a right side of the fin is referred as a second side hereinafter, as shown in FIG. 1B. The second side has a trench which is opened at a central portion opposite to the first side.

Referring to FIGS. 1A and 1B, a semiconductor device 100 is formed on an SOI substrate, which comprises a channel region 11 at a central portion of a semiconductor fin, a source region 12 and a drain region 13 at two ends of the fin respectively, a gate stack disposed adjacent to the first side of the fin, which comprises a first gate dielectric 16, a first conductor layer 17, a second gate dielectric 18 and a second conductor layer 19, and an insulating filler for filling the trench at the second side of the fin. In the semiconductor device, the first and second sides are two opposing sides of the semiconductor fin, which stand upward on the SOI substrate with a substantially right angle.

The semiconductor device 100 is used as an NVM, where the first conductor layer 17 in the gate stack serves as a floating gate for storing charges, and the second conductor layer 19 in the gate stack serves as a control gate.

The gate stack comprises the first gate dielectric 16 extending away from the first side and being adjacent to the channel region 11, the first conductor layer 17 extending away from the first side and being adjacent to the first gate dielectric 16, the second gate dielectric 18 extending away from the first side and being adjacent laterally to one side of the first conductor layer 17, and the second conductor layer 19 extending away from the first side and being adjacent laterally to one side of the second gate dielectric 18.

Specifically, the fin is formed from an SOI layer of the SOI substrate.

The trench at the second side is filled with an insulating material, such as Si3N4. The channel region is arranged between the first side and the trench at the second side, which has a very small thickness in the range of about 5 nm to 40 nm. The thickness of the channel region is approximately equal to that of the conventional FinFET, and provided with a similar self-alignment process.

The inventor has found that the gate arranged at the first side of the fin, instead of a double gate configuration, can still control the whole channel region and thus suppress the short channel effect, if the thickness of the channel region is set to be in the above range.

Preferably, the semiconductor device further includes stressors 14, 15 which apply stress to the source region 12 and the drain region 13 respectively. The stressors 14, 15 contact the source region 12 and the drain region 13 respectively, with a contact area as large as possible so that a contact resistance between the stressors 14, 15 and the source region 12 and the drain region 13 can be minimized. As shown in FIGS. 1A and 1B, the source region 12 and the drain region 13 have recessed steps where the stressors 14, 15 are disposed with one side and a bottom thereof in contact with the source region 12 and the drain region 13.

The stressors 14, 15 induce a stress in the channel region when they are made of an appropriate material, which has a beneficial effect on electrical property of the transistor. In a case of an n-type MOSFET, the stressors 14, 15 should apply tensile stress towards the channel region in a direction parallel to the source and drain regions so as to maximize mobility of electrons which function as charge carriers. On the other hand, in a case of a p-type MOSFET, the stressors 14, 15 should apply compressive stress towards the channel region in a direction parallel to the source and drain regions so as to maximize mobility of holes which function as charge carriers.

It should be noted that the exemplary structure of the semiconductor device shown in FIGS. 1A and 1B includes stressors 14, 15 located in electrical conduction paths between the source region 12 and a source contact (not shown), and between the drain region 13 and a drain contact (not shown). Thus, the stressors 14, 15 are also electrically conductive. For an n-type MOSFET, Si:C doped with As or P can be used for the stressors. For a p-type MOSFET, SiGe doped with B or In can be used for the stressors.

Additional layers and portions of the semiconductor device, which are disposed above the source region 12, the drain region 13 and the gate conductor 19, are not shown in FIGS. 1A and 1B, such as sidewall spacers of the gate, a silicide layer, a source contact, a drain contact, a gate contact, an interlayer insulator and vias formed therein, and a passivation layer.

In the following contents regarding the process steps of fabricating the semiconductor device, some of the above additional layers and portions related to the semiconductor device will be described, but detailed description of those additional layers or portions (for example a source contact, a drain contact, and a gate contact) well known to one skilled person are omitted. For simplicity, the structure of the semiconductor device having been subject to several relevant process steps may be shown in one figure.

Figure 2:
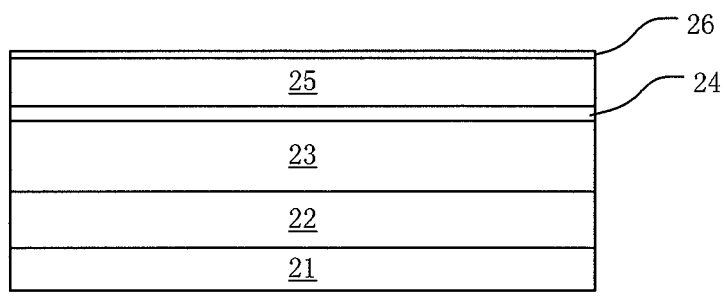
FIGS. 2-9 are cross-sectional views of the structure of the semiconductor device at various stages of fabrication process according to an embodiment of the present invention, taken along line A-A' and for illustrating the process steps of forming a fin and a gate.

Referring to FIG. 2, a method of manufacturing semiconductor device according to an embodiment of the present invention starts with an SOI substrate which is a stack of a bottom substrate 21, a buried oxide layer (BOX) 22 and a top semiconductor layer 23.

By a conventional deposition process, such as PVD, CVD, atomic layer deposition, sputtering and the like, a SiGe layer 24 which has a Ge content of about 5-15% and a thickness of about 3-20 nm and a Si layer 25 which has a thickness of about 30-100 nm are epitaxially grown in sequence on the SOI substrate. The Si layer 25 can be formed either in an independent deposition process or in-situ by using a Si target or a precursor in the same chamber after the SiGe layer 24 is epitaxially grown.

Then, a HfO2 layer 26 which has a thickness of about 3-10 nm is formed on the Si layer 25 by atomic layer deposition or magnetron sputtering.

Figure 3:
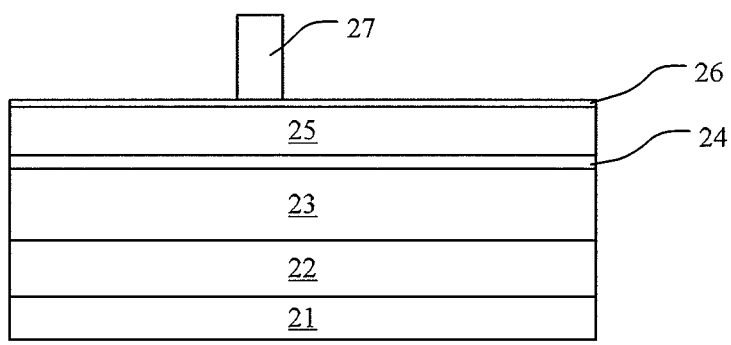

Referring to FIG. 3, by a conventional lithographical process including exposure and development steps, a photoresist pattern 27 in form of a stripe is formed on the HfO2 layer 26.

Figure 4:
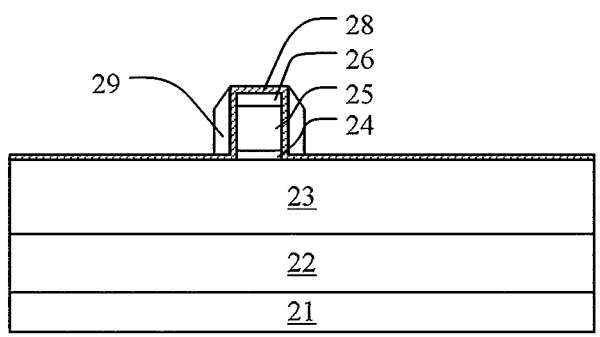

Referring to FIG. 4, with the photoresist pattern 27 as a mask, portions of the HfO2 layer 26, the Si layer 25, and the SiGe layer 24 are selectively removed in sequence by dry etching such as ion beam milling, plasma etching, reactive ion etching, laser ablation and the like, so as to provide a stacked structure of the HfO2 layer 26, the Si layer 25, and the SiGe layer 24 in a stripe pattern.

Two steps may be involved if the reactive ion etching is performed. At the first step, the portions of the HfO2 layer 26 and the Si layer 25 are selectively removed with the SiGe layer 24 as a stop layer, by choosing a suitable gas in an etching atmosphere. At the second step, a portion of the SiGe layer 24 is further selectively removed with the top semiconductor layer 23 of the SOI substrate as a stop layer, by changing to another type of gas in the etching atmosphere. It is well known to one skilled person that one of the SiGe layer and the Si layer can be selectively removed by controlling an etch selectivity with a different type of gas in an etching atmosphere being used in the reactive ion etching process.

Then, the photoresist pattern 27 is removed by ashing or dissolution with a solvent.

A conformal thin oxide layer 28 which has a thickness of about 2-5 nm is formed on the stacked structure in the stripe pattern and on an exposed portion of the top semiconductor layer 23 of the SOI substrate.

The thin oxide layer can be formed by a conventional deposition process, such as PVD, CVD, atomic layer deposition, sputtering and the like.

Then, a conformal nitride layer is firstly formed and then has a portion thereof being removed so as to provide nitride spacers 29 which has a thickness of about 5-50 nm at both sides of the stacked structure comprising the HfO2 layer 26, the Si layer 25 and the SiGe layer 24.

Figure 5:
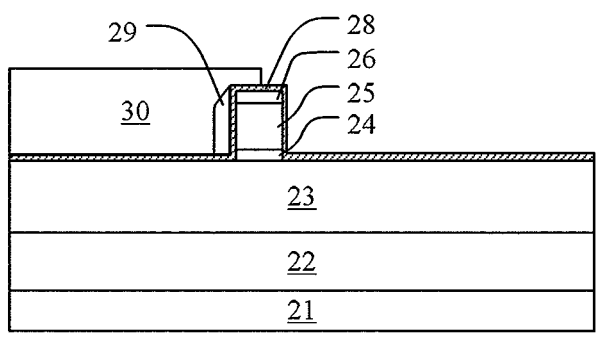

Referring to FIG. 5, by a conventional lithographical process including exposure and development steps, a photoresist pattern 30 is formed on the structure shown in FIG. 4 so as to mask the spacer at the left side and the left portion of the stacked structure.

Figure 6:
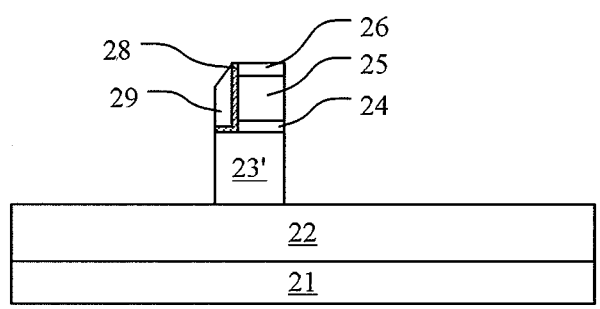

Referring to FIG. 6, with the photoresist pattern 30 as a mask, the spacer at the right side of the stacked structure is removed by an isotropic etching process, such as conventional wet etching using a solution of etchant.

Alternatively, the spacer at the right side of the stacked structure can be removed in three steps. At the first step, with the photoresist pattern 30 as a mask, an angular implantation of Ge is performed so as to cause damages in the spacer at the right side of the stacked structure. At the second step, the photoresist pattern 30 is removed by ashing or dissolution with a solvent. At the third step, by wet etching or dry etching, the spacer at the right side is selectively removed relative to the spacer at the left side.

After the spacer at the right side of the stacked structure is removed, the portion of the thin oxide layer 28 that is exposed on the main surface of the semiconductor structure is selectively removed by choosing a suitable gas in an etching atmosphere for example in an reactive ion etching. Then, with the remaining portion of the thin oxide layer 28, the spacer 29 at the left side of the stacked structure and the stacked structure comprising the HfO2 layer 26, the Si layer 25 and the SiGe layer 24 as a hard mask, an exposed portion of the top semiconductor layer of the SOI substrate is selectively removed by changing to another type of gas in the etching atmosphere, for example by a reactive ion etching, so as to provide a semiconductor fin 23' in a self-aligned manner.

Figure 7:
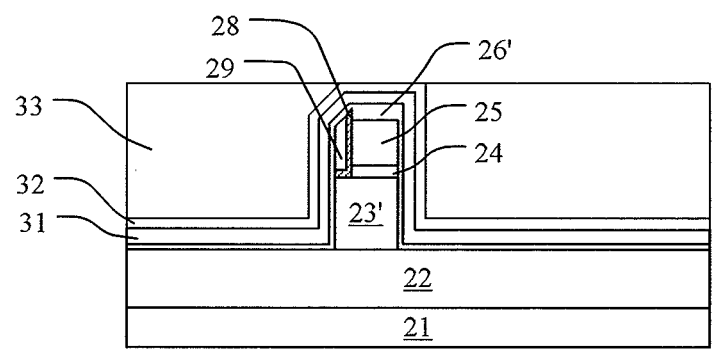

Referring to FIG. 7, for example, by CVD or atomic layer deposition, a conformal thin oxide layer 26' (for example, HfO2) which has a thickness of about 2-4 nm, a conformal metal layer 31 (for example, TiN, which is a metal ceramic) which has a thickness of about 3-10 nm, a conformal nitride layer 32 which has a thickness of about 5-15 nm, and a blanket polysilicon layer 33 are formed in sequence on the main surface of the semiconductor structure shown in FIG. 6. In the following steps, the thin oxide layer 26', the metal layer 31, the nitride layer 32 and the polysilicon layer 33 will provide the first gate dielectric 16, the first conductor layer 17, the second gate dielectric 18, and the second conductor layer 19. The first gate dielectric 16, the first conductor layer 17, the second gate dielectric 18, and the second conductor layer 18 can be made of the materials of the gate dielectric and the gate conductor as mentioned above.

Preferably, the polysilicon layer 33 can be in-situ doped so as to improve an electrical conductivity.

The polysilicon layer 33 covers the whole top of the semiconductor structure. Then, the polysilicon layer 33 is subjected to a planarization process such as chemical mechanical polishing (CMP). The CMP stops at the top of the nitride layer 32 so as to provide a flat surface for the semiconductor structure.

Figure 8:
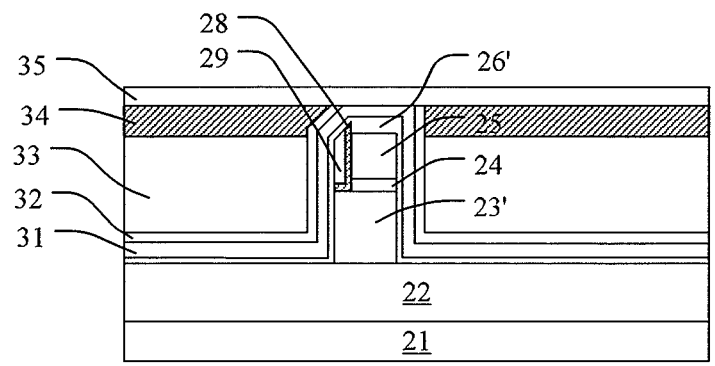

Referring to FIG. 8, by wet etching or dry etching, a portion of the polysilicon layer 33 is selectively removed relative to the nitride layer 32 so that the polysilicon layer 33 is etched back. Then, for example by CVD, a blanket oxide layer 34 is formed on the whole surface of the semiconductor structure.

The oxide layer 34 is subjected to CMP which removes a portion of the nitride layer 32 above the fin 23' and stops at the top of the metal layer 31 so as to provide a flat surface for the semiconductor structure. Consequently, the oxide layer 34 fills the portion of the polysilicon layer 33 removed by etching back.

Then, for example by CVD, a nitride layer 35 is formed on the main surface of the semiconductor structure.

Figure 9:
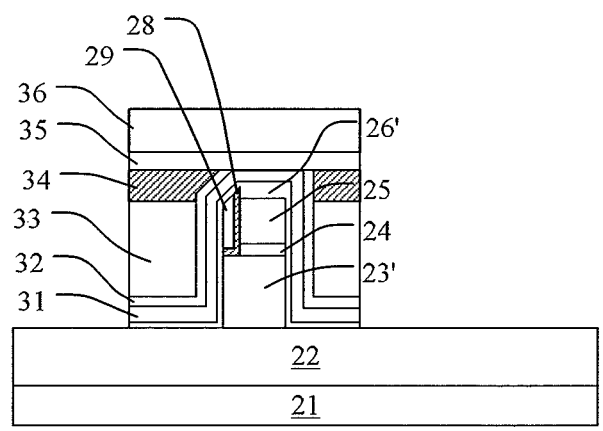

Referring to FIG. 9, by a conventional lithographical process including exposure and development steps, a photoresist pattern 36 in form of a stripe is formed for defining a gate region of the device.

Then, with the photoresist pattern 36 as a mask and the buried oxide layer (BOX) 22 of the SOI substrate as a stop layer, portions of the nitride layer 35, the oxide layer 34, the polysilicon layer 33, the nitride layer 32, the metal layer 31 and the thin oxide layer 26' that are located on two sides of the fin 23' are removed in sequence by dry etching, such as ion beam milling, plasma etching, reactive ion etching, laser ablation and the like.

Figure 10:
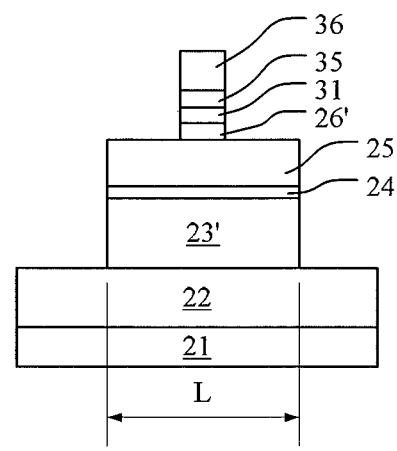
FIGS. 10-16 are cross-sectional views of the structure of the semiconductor device at various stages of the subsequent fabrication process according to an embodiment of the present invention, taken along line 1-1' and for illustrating the process steps of forming source/drain region.

Corresponding to the cross sectional view of the semiconductor structure along line A-A' shown in FIG. 9, FIG. 10 shows the cross sectional view of the semiconductor structure along line 1-1'. In the etching step with the photoresist pattern 36 as a mask, a stack of the nitride layer 35, the metal layer 31, and the thin oxide layer 26' is provided on the Si layer 25.

Before or after the above etching step, an additional masking step and an additional etching step can be involved so as to remove portions of the fin 23', the SiGe layer 24 and the Si layer 25 so as to define a length of the fin. FIG. 10 shows the dimension L of the length of the fin 23' in a horizontal direction after these steps.

Figure 11:
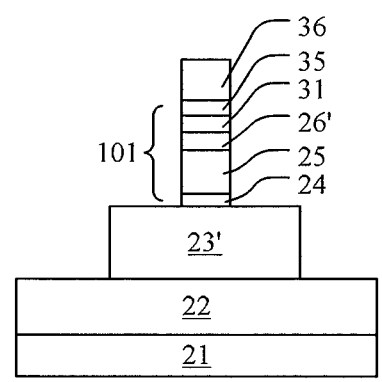

Referring to FIG. 11, still with the photoresist pattern 36 as a mask, portions of the Si layer 25 and the SiGe layer 24 are selectively removed in sequence by dry etching such as ion beam milling, plasma etching, reactive plasma etching, laser ablation and the like, which stops at the top of the fin 23'. Consequently, a stack 101 of layers including the nitride layer 35, the metal layer 31, the thin oxide layer 26', the second Si layer 25 and the SiGe layer 24 is provided on the fin 23'.

Figure 12:
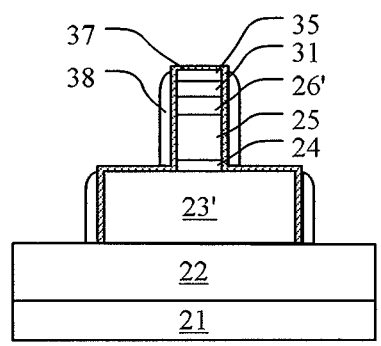

Referring to FIG. 12, the photoresist pattern 36 is removed by ashing or dissolution with a solvent.

Then, for example by CVD, a conformal oxide layer 37 which has a thickness of about 2-5 nm and a conformal nitride layer 38 which has a thickness of about 10-20 nm are formed in sequence on the whole surface of the semiconductor structure.

By dry etching, such as ion beam milling, plasma etching, reactive ion etching, laser ablation and the like, a portion of the nitride layer 38 is removed, with the oxide layer 37 as a stop layer, so as to form nitride spacers 38 at both sides of the fin 23' and the stack of layers 101 respectively.

Figure 13:
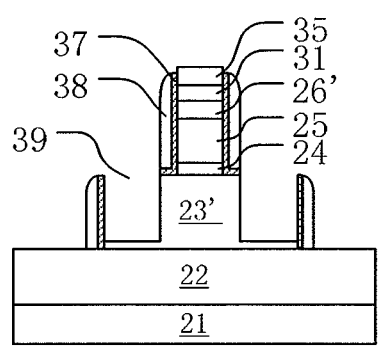

Referring to FIG. 13, with the stack of layers 101 and the nitride spacers 38 as a hard mask, a portion of the oxide layer 37 exposed at the main surface and a portion of the semiconductive material of the fin 23' are removed by dry etching, such as ion beam milling, plasma etching, reactive ion etching, laser ablation and the like, so as to provide openings 39 at two ends of the fin 23' in its length direction (i.e. a horizontal direction in the drawing). A thin layer of semiconductive material, which has a thickness of about 10 nm, remains at the bottom of the openings 39. The thin layer of semiconductive material is a part of the original SOI layer of the SOI substrate.

The etching step is performed in a self-aligned manner, where the size of the openings 39 is defined by the oxide layer 37 and the nitride spacers 38.

Figure 14:
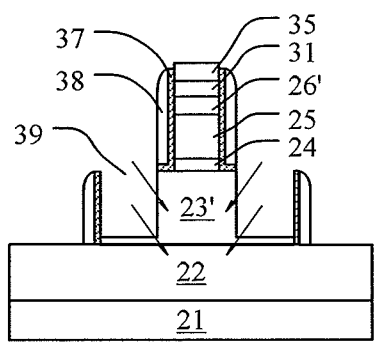

FIG. 14 shows an optional step of the manufacturing method according to some embodiments, in which an angular ion implantation is performed through the openings 39 towards to the central portion of the fin 23' so as to provide halos in channel or in the substrate below the channel (i.e. a halo implantation). As a dopant for an n-type MOSFET, B or BF2 may be used. As a dopant for a p-type MOSFET, As or P may be used.

Figure 15:
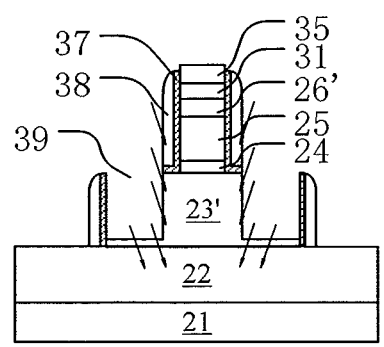

FIG. 15 shows an optional step of the manufacturing method according to some embodiments, in which an angular ion implantation is performed through the openings 39 towards to a central portion of the fin 23' so as to provide source/drain extensions (i.e. an extension implantation). As a dopant for an n-type MOSFET, As or P may be used. As a dopant for a p-type MOSFET, B or BF2 may be used.

Compared with the halo implantation, the extension implantation uses a relatively small implantation angle and a relatively large implantation energy. Consequently, in the extension implantation, most of the implanted ions pass through the thin layer of semiconductive material at the bottom of the openings 39 so that no amorphous phase occurs in the thin layer of semiconductive material.

As a process step, an appropriate source/drain implantation can be performed.

Since the openings 39 provide a window for ion implantation, and the nitride layer 35, the oxide layer 37 and the nitride spacers 38 on the surface of the semiconductor structure provide a hard mask, the above extension implantation, halo implantation and the source/drain implantation can be performed in-situ, which reduces the number of masks needed and simplifies the process steps.

Figure 16:
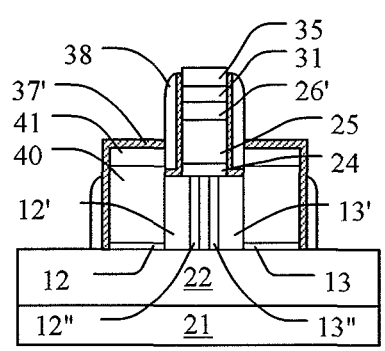

Referring to FIG. 16, the resultant semiconductor structure is subjected to an anneal treatment, for example spike anneal. The anneal treatment is used to activate dopants injected at the previous implantation steps and to eliminate implant damages.

After the anneal treatment, the doping profile in the fin 23' of semiconductive material is also shown in FIG. 16, which includes a source region 12 and a drain region 13 provided at the bottom of the openings 39, a source extension 12' adjacent to the source region 12, a drain extension 13' adjacent to the drain region 13, a source halo 12" adjacent to the source extension 12' and extending towards to the central portion of the fin 23', and a drain halo 13" adjacent to the drain extension 13' and extending towards to the central portion of the fin 23'.

Then, by a conventional deposition process, such as PVD, CVD, atomic layer deposition, sputtering and the like, stressors 40 and epitaxial silicon layer 41 are epitaxially grown in sequence in the openings 39. Due to the epitaxial growth, the stressors 40 form only on the thin layer of semiconductive material at the bottom of the openings 39, without using an additional mask. For a p-type MOSFET, the stressors 40 may be made of SiGe which has a Ge content of about 20-50% and is doped with B in-situ, so as to apply a compressive stress to the channel region from the source/drain regions after the epitaxial growth to improve an electrical property of the p-type MOSFET. For an n-type MOSFET, the stressors 40 may be made of Si:C which has a C content of about 0.5-2% and is doped with As or P in-situ, so as to apply a tensile stress to the channel region from the source/drain regions after the epitaxial growth to improve an electrical property of the n-type MOSFET.

Then, the resultant semiconductor structure is subjected to oxidation so that a top of the epitaxial silicon layer 41 is oxidized and provides a thin oxide layer 37' which has a thickness of about 3-10 nm. The epitaxial silicon layer 41 at the top of the stressors 40 is used to provide a high-quality SiO2 layer.

Figure 17:
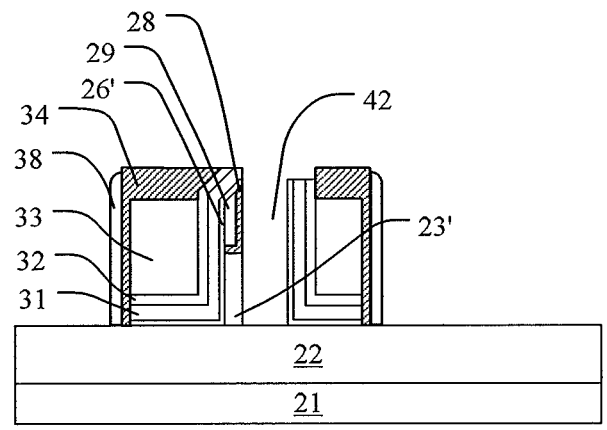
FIGS. 17-18 are cross-sectional views of the structure of the semiconductor device at various stages of the subsequent fabrication process according to an embodiment of the present invention, taken along line A-A' and for illustrating the process steps of forming a channel region.

Referring to FIG. 17, with the oxide layer 34 formed in the step shown in FIG. 8 as a hard mask and the buried oxide layer 22 of the SOI wafer as a stop layer, portions of the metal layer 31, the thin oxide layer 26', the Si layer 25, the SiGe layer 24 and the fin 23' are removed in sequence by dry etching such as ion beam milling, plasma etching, reactive ion etching, laser ablation and the like, so as to provide a trench 42 in a self-aligned manner. In this step, the oxide layer 28 and the nitride spacers 29 are used as a hard mask for defining a thickness of a central portion of the fin 23'. In other words, the central portion of the fin 23' has a thickness of about a sum of thickness of the oxide layer 28 and the nitride spacers 29. A trench is provided at this step. As will be indicated, the central portion of the fin will form a channel region 11. Due to the absence of the removed materials (i.e. a stack of Si/SiGe/Si) in the etching step, the stress in the channel region can be further increased, which further improves an electrical property of the device.

At the right portion of the inner wall of the trench 42, a portion of the stack of the thin oxide layer 26', the metal layer 31, the polysilicon layer 32, the polysilicon layer 33 and the oxide layer 34 remains. In the manufacture of an integrated circuit including a plurality of MOSFETs having the same structure, the portion of the stack of the thin oxide layer 26', the metal layer 31, the polysilicon layer 32, the polysilicon layer 33 and the oxide layer 34 at the right portion of the inner wall of the trench 42 may be used to provide a gate region for an adjacent MOSFET (not shown in FIG. 17), and the insulating filler in the trench 42 may provide a shallow trench isolation.

Moreover, as shown in FIG. 17, the nitride spacers 38 formed in the step shown in FIG. 12 remain at the sidewall of the multilayer gate conductor.

Preferably, a super steep retrograde well (SSRW) is used so as to decrease the thickness of the fin 23'. The SSRW is formed in the fin 23, adjacent to the channel region at the second side of the fin which is opposite to the first side of the fin adjacent to the thin oxide layer 26'. The process for forming SSRW can be found in the following documents:

1) G. G. Shahidi, D. A. Antoniadis and H. I. Smith, IEEE TED Vol. 36, p. 2605, 1989
2) C. Fiegna, H. Iwai, T. Wada, M. Saito, E. Sangiorgi and B. Ricc"°, IEEE TED Vol. 41, p. 941, 1994.
3) J. B. Jacobs and D. A. Antoniadis, IEEE TED Vol. 42, p. 870, 1995.
4) S. E. Thompson, P. A. Packan and M. T. Bohr, VLSI Tech Symp., p. 154, 1996.

Then, the following two steps are performed so as to remove the nitride spacer at the left side. At the first step, with the oxide layer 34 as a mask, an angular implantation of Ge is performed so as to cause damages in the nitride spacer 38 at the left side of the stacked structure. At the second step, by wet etching or dry etching, the nitride spacer at the left side is selectively removed relative to the spacer at the right side.

Figure 18:
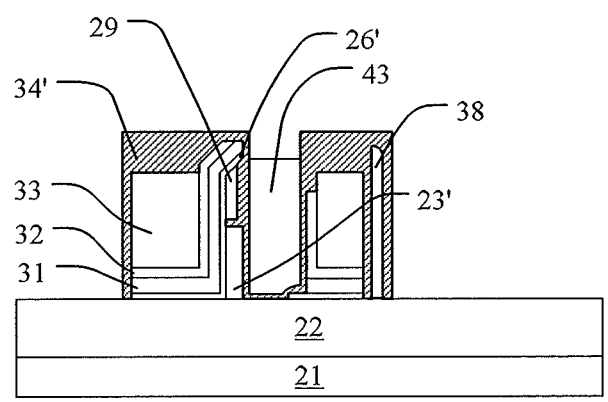

Referring to FIG. 18, for example by CVD, a conformal thin oxide layer 34' which has a thickness of about 2-5 nm is formed on the whole surface of the semiconductor structure. For example by CVD, a nitride is then deposited to a thickness sufficient for filling up the trench 42. The nitride layer is selectively etched back relative to the oxide layer 34' so that the portion of the nitride layer around the trench 42 is completely removed and the nitride filler 43 remains in the trench 42.

Figure 19A:
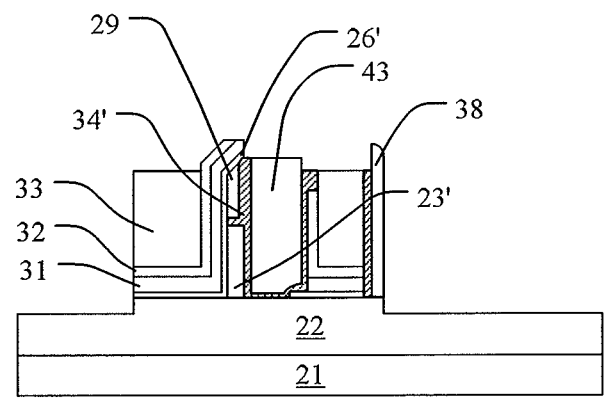
FIGS. 19A, 19B, 20A and 20B are cross-sectional views of the structure of the semiconductor device at various stages of the subsequent fabrication process according to an embodiment of the present invention, taken along line A-A' for FIGS. 19A and 20A, line 2-2' for FIGS. 19B and 20B, and for illustrating the process steps of forming a silicide layer on the source/drain region and the gate.
Figure 19B:
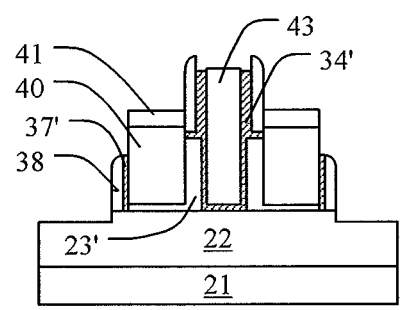

Referring to FIGS. 19A and 19B, by dry etching such as ion beam milling, plasma etching, reactive ion etching, laser ablation and the like, exposed portions of the oxide layer 34' is selectively removed relative to the nitride filler 43.

Due to the etching, only the portions of the oxide layer 34' at a sidewall and a bottom of the trench 42 having been filled with nitride filler 43 remain. Consequently, a top surface and a left side of the polysilicon layer 33 of the multilayer gate conductor, and a top surface of the epitaxial silicon layer 41 at the source/drain regions are exposed.

The etching step also removes a portion of the buried oxide layer 22 of the SOI substrate.

Figure 20A:
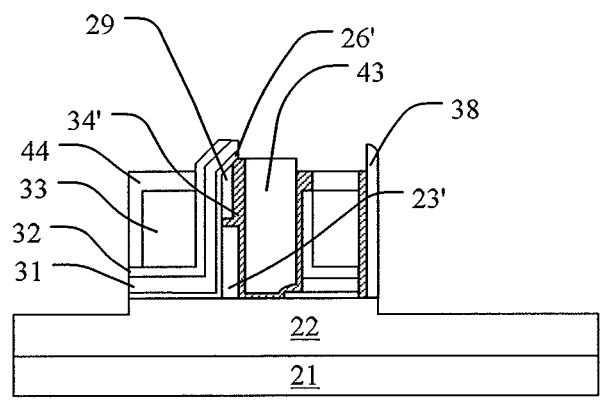
Figure 20B:
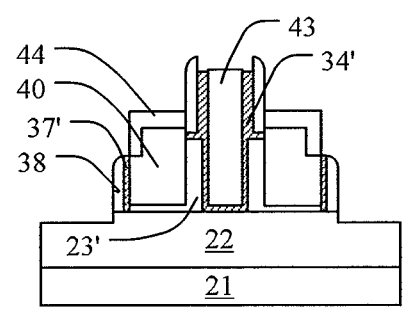

Referring to FIGS. 20A and 20B, by a conventional silicidation process, a portion of the top surface and the left side of the polysilicon layer 33 of the multilayer gate conductor, and at least a portion of the epitaxial silicon layer 41 at the source/drain regions are converted to silicide layers 44, so as to minimize a contact resistance between the gates, the source/drain and the corresponding metal contacts.

For example, a Ni layer which has a thickness of about 5-12 nm is firstly deposited, and then subjected to a heat treatment at a temperature in a range of about 300-500° C. for about 1-10 seconds, so that at least a portion of the polysilicon layer 33 and the epitaxial silicon layer 41 is converted to NiSi. Finally, the unreacted Ni is removed by wet etching.

After the steps shown in FIGS. 2-20 are finished, an interlayer insulator may be formed on the resultant semiconductor structure, and vias may be provided therein, wirings and electrical contacts may be provided on an upper surface of the interlayer insulator in conventional processes well known in the art, so that other parts of the semiconductor device are formed.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A semiconductor device, comprising
    an SOI substrate;
    a semiconductor fin formed on the semi-conductor-on-insulator ("SOI") substrate, the semiconductor fin having a first side and a second side which are opposite to each other and stand upward on a surface of the SOI substrate, and a trench which is opened at a central portion of the second side and opposite to the first side;
    a channel region formed in the fin and being between the first side and the trench at the second side;
    source and drain regions formed in the fin and sandwiching the channel region; and
    a gate stack formed on the SOI substrate and being adjacent to the first side of the fin,
    wherein the gate stack comprises a first gate dielectric extending away from the first side and being adjacent to the channel region, a first conductor layer extending away from the first side and being adjacent to the first gate dielectric, a second gate dielectric extending away from the first side and being adjacent laterally to one side of the first conductor layer, and a second conductor layer extending away from the first side and being adjacent laterally to one side of the second gate dielectric.

2. The semiconductor device according to claim 1, wherein the source and drain regions extend to sandwich the trench at the second side of the semiconductor fin.

3. The memory device according to claim 1, the trench at the second side of the semiconductor fin is filled with an insulating material.

4. The semiconductor device according to claim 1, wherein the channel region has a thickness in a range of about 5-40 nm.

5. The semiconductor device according to claim 1, further comprising a super steep retrograde well formed between the channel region and the trench at the second side of the semiconductor fin.

6. The semiconductor device according to claim 1, wherein the first conductor layer and the second conductor layer are made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni3Si, Pt, Ru, Ir, Mo, HfRu, RuOx, or any combinations thereof.

7. The semiconductor device according to claim 1, further comprising stressors formed on and applying stress to the source and drain regions respectively.

8. The semiconductor device according to claim 7, wherein the source and drain regions have recessed steps where the stressors disposed.

9. The semiconductor device according to claim 7, wherein the stressors are made of SiGe or Si:C.

10. The semiconductor device according to claim 1, further comprising source and drain extensions in the semiconductor fin which are adjacent to the source and the drain regions respectively and extend toward the channel region.

11. The semiconductor device according to claim 1, further comprising source and drain halos in the semiconductor fin which are adjacent to the source and the drain regions respectively and extend toward the channel region.

12. The semiconductor device according to claim 1, wherein the semiconductor fin is formed from an SOI layer of the SOI substrate and located on a buried oxide layer of the SOI substrate.

* * * * *

UNITED STATES PATENT AND TRADEMARK OFFICE
CERTIFICATE OF CORRECTION

PATENT NO. : 8,598,595 B2  Page 1 of 1
APPLICATION NO. : 13/003873
DATED : December 3, 2013
INVENTOR(S) : Zhu et al.

It is certified that error appears in the above-identified patent and that said Letters Patent is hereby corrected as shown below:

On the Title Page

Page 1 (item 75, Inventors) at line 2, Change "Poughkepsie, NY(US);" for Zhijiong Luo to --Poughkeepsie, NY(US);--.

In column 2 (page 2, item 56) at line 20, Under Other Publications, change "VSLI" to --VLSI--.

In column 2 (page 2, item 56) at line 20, Under Other Publications, change "Tecnical" to --Technical--.

In the Specification

In column 4 at line 49, Change "invention" to --invention.--.

In column 10 at line 61, Change "1989" to --1989.--.

In the Claims

In column 12 at line 23, In Claim 3, change "memory" to --semiconductor--.

Signed and Sealed this
First Day of July, 2014

Michelle K. Lee
*Deputy Director of the United States Patent and Trademark Office*